United States Patent [19]
Diestelhorst

[11] Patent Number: 6,023,062
[45] Date of Patent: Feb. 8, 2000

[54] METHOD AND DEVICE FOR CONVERTING INFRA-RED RADIATION INTO ELECTRIC SIGNALS WITH HIGH AMPLIFICATION

[76] Inventor: Martin Diestelhorst, Burgstrasse 21, 06114 Haale (Saale), Germany

[21] Appl. No.: 08/989,252

[22] Filed: Dec. 12, 1997

[51] Int. Cl.[7] .................................................... G01J 5/24
[52] U.S. Cl. ...................................... 250/338.2; 250/338.3
[58] Field of Search ............................... 250/338.2, 338.3

[56] References Cited

PUBLICATIONS

M. Diestelhorst (Martin–Luther–Universität, . . . ), "Nichtlineares Verhalten im ferroelektrischen TGS", 15 Fruhjahrsschule Ferroelektrizität in Fincken 1987, Martin–Luther–Universität WB 1987/67 (024), pp. 68–77.

Kurt Wiesenfeld et al, "Small–signal amplification in bifurcating dynamical systems", Physical Review A, vol. 33, No. 1, Jan. 1986.

*Primary Examiner*—Constantine Hannaher
*Assistant Examiner*—Andrew Israel
*Attorney, Agent, or Firm*—Collard & Roe, PC

[57] ABSTRACT

A method and apparatus for converting infra-red radiation into electrical signals having a higher effective amplification is provided. This is accomplished by the steps of: (1) allowing the infra-red radiation of a properly chosen modulation frequency to reach a ferroelectric TGS crystal coupled to a nonlinear dynamic system such as a nonlinear series resonance circuit; (2) varying the amplitude and frequency of the driving voltage of the circuit, or the temperature of the ferroelectric crystal; (3) stabilizing the nonlinear dynamic circuit near a dynamic instability point, and particularly a period doubling bifurcation point, by adjusting the amplitude and frequency of the driving voltage or the temperature of the crystal, so the selected modulation frequency of the infra-red radiation is half the driving frequency of the nonlinear dynamic system, and (4) measuring the electrical signal produced by the ferroelectric crystal and amplified in the nonlinear dynamic system near its dynamic instability point.

6 Claims, 10 Drawing Sheets

METHOD AND DEVICE FOR CONVERTING INFRA-RED RADIATION INTO ELECTRIC SIGNALS WITH HIGH AMPLIFICATION

BACKGROUND OF THE INVENTION

1. Field of the Invention

This invention relates to an improved pyroelectric detector as part of a nonlinear dynamic system with a higher effective amplification whereby random incoming infra-red radiation is converted into electrical signals. The invention uses the effect that nonlinear dynamic systems near their bifurcation point can act to amplify small signals. Thus, it is possible to develop practical infra-red sensor applications.

The invention uses the well known applications of pyroelectric detectors. In pyroelectric materials, relatively small temperature changes cause high electric fields. The present invention converts the temperature change into an electric signal in a nonlinear dynamic system, and amplifies that signal in the same nonlinear system.

2. The Prior Art

Conventional pyroelectric detectors make use of ferroelectrics, which first have to be polarized for that application. One of the best materials used in pyroelectric detectors is modified triglycine sulphate (TGS). These modifications are specially doped TGS-crystals (e.g. L-alanine-doped or deuterated) to stabilize a high internal bias field and to increase the sensitivity of the material.

Furthermore, it is well-known, that a series-resonance circuit with ferroelectric TGS capacitor can exhibit different kinds of bifurcations (symmetry-breaking and period-doubling bifurcations) according to the theory of nonlinear dynamic systems. The bifurcations may be observed, if the external parameters of the circuit (amplitude and frequency of the driving voltage and temperature of the ferroelectric capacitor) are suitably chosen. The amplitude of the driving voltage is in the order of magnitude of the coercive field strength of the ferroelectric in these cases.

SUMMARY OF THE INVENTION

Near the onset of such bifurcations, nonlinear dynamic systems are very sensitive to small periodic disturbances or changes. If the frequency of the periodic changes or disturbances is properly chosen (depending on the frequency of the driving voltage and on the type of bifurcation) the change may be amplified. This effect is called small-signal amplification.

This effect has been investigated experimentally using a series resonance circuit with ferroelectric TGS capacitor, by amplifying the periodic amplitude modulation signals of the driving voltage near period-doubling and symmetry breaking bifurcations. The system can be tuned towards these bifurcations by increasing the driving amplitude, or by changing the driving frequency at a sufficiently high driving amplitude level. It is also possible to reach a bifurcation by increasing the temperature of the ferroelectric material towards the temperature of the phase transition $T_c$ (M. Diestelhorst: Nichtlineares Verhalten im ferroelektrcshien TGS, 15. Fruhjahrsschule Ferroelektrizitat in Fincken 1987, Martin-Luther-Universitat WB 1987/67 (O 24), pp. 68–77). These parameters can be adjusted exactly. Thus, it is possible to narrowly tune the nonlinear dynamic system to the bifurcation.

It is well known that nonlinear dynamic systems can amplify small periodic signals of suitably chosen frequencies if they are in the vicinity of a bifurcation (K. Wiesenfeld and B. McNamara: Small-signal amplification in bifurcating dynamical systems, Phys. Rev. A33 (1986), 629–642). As to which frequencies are amplified depends upon the type of bifurcation. In the case of a period-doubling bifurcation, a change will be amplified if its frequency $\omega$ is close to $(n+\frac{1}{2})\Omega$, where $\Omega$ is the driving frequency of the series resonance circuit and n is an integer. The amplification gain depends on the distance E of the system from the bifurcation as well as on the difference of frequency $\Delta\Omega = \omega - (n+\frac{1}{2})$ thus:

$$S = \frac{K}{(\Delta\Omega)^2 + E^2}$$

The parameter E is the absolute value of the real part of the Floquet exponent which crosses the imaginary axis at the period-doubling bifurcation at $i\Omega/2$ ($i=\sqrt{-1}$). This parameter may be tuned by varying of the external parameters (e.g. amplitude and frequency of the driving voltage or temperature of the TGS-capacitor). E is zero at the bifurcation point.

The essential fact is that nonlinear dynamic systems approaching the bifurcation point can amplify periodic changes.

It is an object of the invention of the investigation to apply the effect of small-signal amplification in combination with the pyroelectric properties of the ferroelectric capacitor to detect periodically incident infra-red radiation. Thus, it will be possible to create a pyroelectric detector with high gain amplification that is completely different from other known amplification principles.

In the invention, a periodic temperature modulation signal of a ferroelectric TGS-capacitor coupled to a series resonance circuit, (caused by the infra-red radiation) and using the pyroelectric effect of the TGS crystal is converted into an electrical signal that is amplified simultaneously in the same circuit by the effect of small-signal amplification near a bifurcation. In ferroelectric materials, a change of temperature causes a change of polarization via the pyroelectric effect according to the relation $$p = \frac{dP}{dt}$$

where p is the pyroelectric coefficient, P is the polarization and T is the temperature of the ferroelectric. In ferroelectric materials along the polar axis dP/dT may be replaced by dD/dT. A periodic modulation of the temperature of the ferroelectric causes a periodic modulation of the dielectric displacement D of the ferroelectric capacitor and hence in the whole system.

To achieve the desired effect the system has to be stabilized just below a dynamic instability. The incident infra-red radiation has to be modulated with a properly chosen frequency depending on the type of bifurcation. In the case of a period-doubling bifurcation, the frequency has to be exactly half the driving frequency ($\omega=\Omega/2$) or an odd multiple of this frequency. It has to be mentioned here that up to this stage the desired effect cannot be observed. The desired effect occurs only sporadically.

This problem may be solved only by means of phase-locking the modulation signal of the infra-red radiation to the driving voltage and defining the phase relation between these two signals in a unique manner. Then a variation of the phase leads to a range of the phase angle where large signals may be detected at the frequency of the infra-red modulation. At this frequency ($\Delta\omega/2\pi=0$Hz) there appears a peak in the spectrum which is caused by the infra-red radiation.

So it is possible to convert the temperature modulation via the pyroelectric effect into an electric signal within the nonlinear series resonance circuit driven just below a bifurcation and to amplify and detect this signal by the effect of small-signal amplification in the same circuit.

Thus, the nonlinear series resonance circuit as a special nonlinear dynamic system has to be adjusted near a bifurcation by variation of the following external parameters: temperature of the ferroelectric capacitor, amplitude of the driving voltage and frequency of the driving voltage.

Then the ferroelectric capacitor of the circuit has to be illuminated by a modulated infra-red radiation of a properly chosen frequency (depending on the kind of bifurcation) and properly chosen phase-locked phase angle of the modulation relative to the driving voltage. Then the spectrum of the response of the series resonance circuit contains additional peaks which may be used for detection of the infra-red radiation.

The required device may be described in the following manner: A ferroelectric TGS-crystal serves simultaneously as pyroelectric detector and as nonlinear capacitor in a series resonance circuit. The ferroelectric crystal is not only the nonlinear element of the system but also the coupling element for the infra-red radiation. Further elements of the nonlinear series resonance circuit are a linear inductance and a linear capacitor. The following are advantages over the traditional pyroelectric detectors:

By means of the invention much higher detector signals are achievable than in traditional pyroelectric infra-red detectors on the basis of the most sensitive materials for pyroelectric detectors (modified TGS).

Because of the high detectivity at relatively high modulation frequencies of the incident infra-red radiation fast events may be better detected than with traditional pyroelectric infra-red detectors.

In contrast to traditional pyroelectric infra-red detectors it is not necessary to stabilize a single domain state or a preference orientation of the polarization in the ferroelectric material of the detector.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1A:
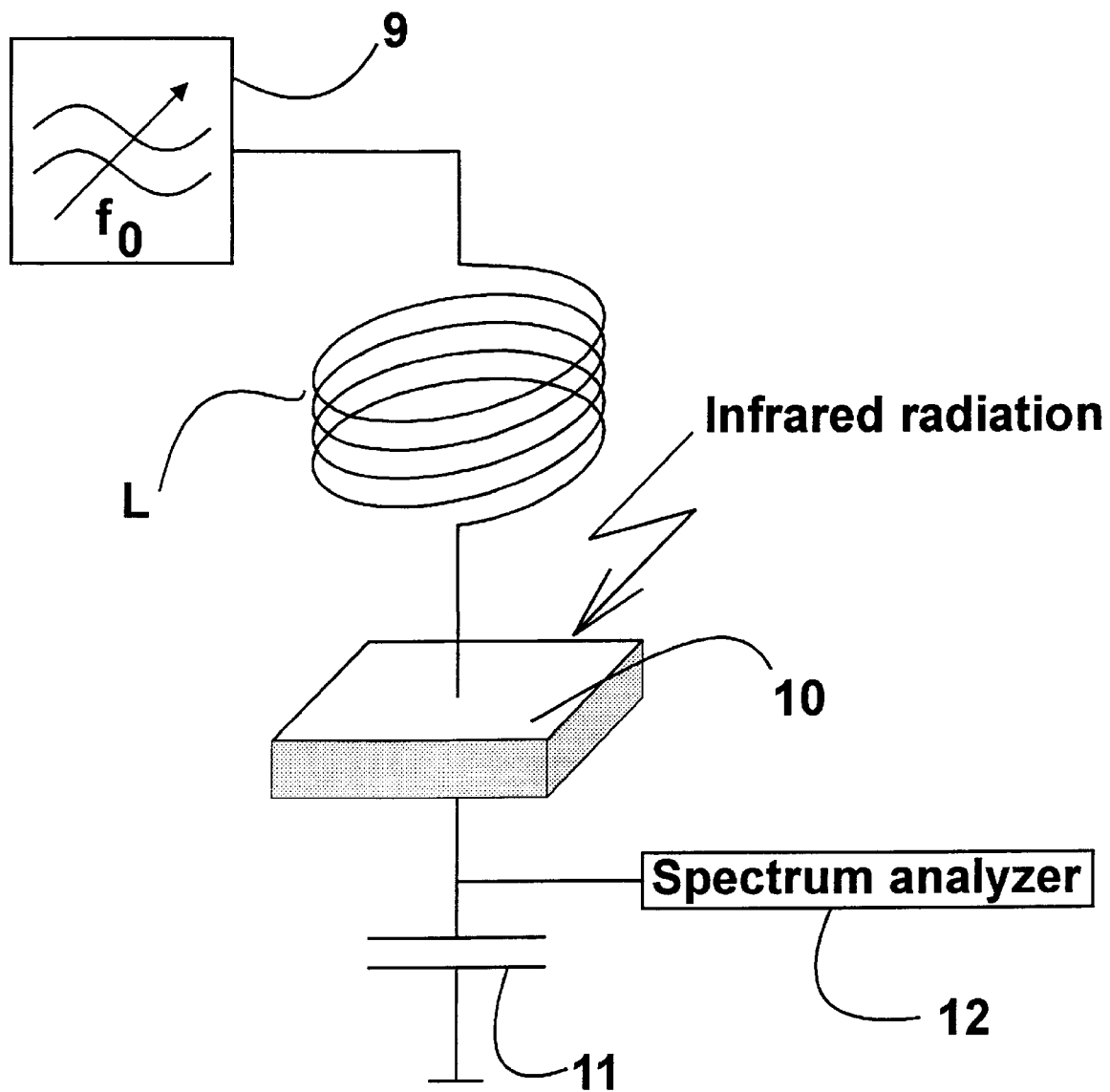
FIG. 1a shows the infra-red detector coupled to a spectrum analyzer.

Referring to FIG. 1a, there is shown a series resonant circuit which detects a periodic infra-red signal near a period-doubling bifurcation, and which uses a TGS crystal 10 as the ferroelectric detector material. The periodic infra-red signal here has been generated by an infra-red diode (not shown).

The nonlinear TGS-crystal 10 serves as both a nonlinear capacitor of the circuit, and as a coupling element for infra-red radiation. Along the linear capacitor C, the signal of the detector can be measured between capacitor 11 and crystal 10 and detected by any selective voltmeter or spectrum analyzer 12.

Figure 1B:
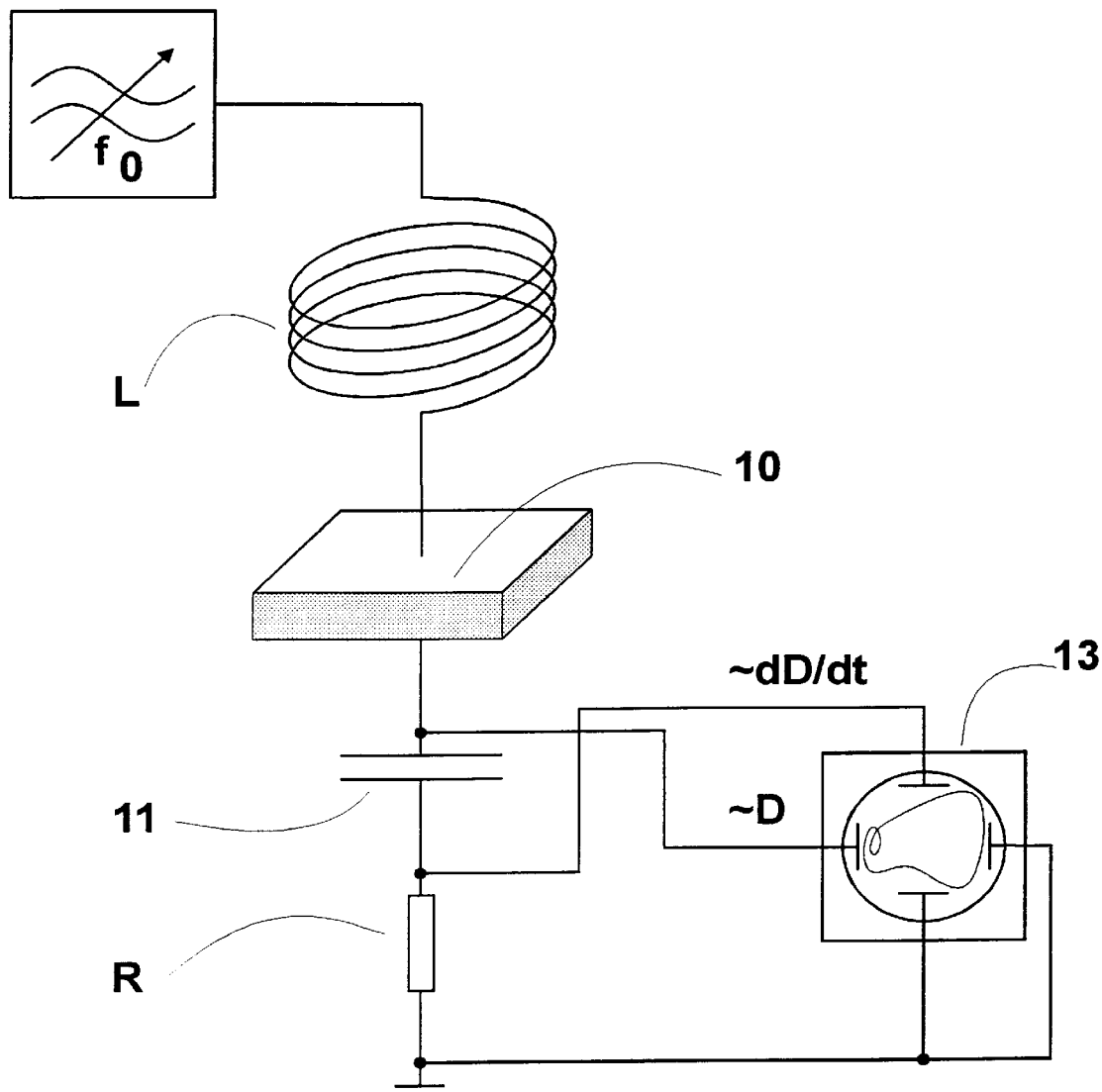
FIG. 1b shows the circuit of FIG. 1a coupled to a digital storage oscilloscope.

This FIG. 1b differs from the embodiment of FIG. 1a, wherein instead of spectrum analyzer 12, there is provided a digital storage oscilloscope 13 to observe the period doubling bifurcation. Thus, it is possible to observe the so called phase portrait of the series resonance circuit. Using the embodiment of FIG. 1a with spectrum analyzer 12, the corresponding spectrum may be observed. FIGS. 1c, 1d, 1e and 1f show both the phase portraits and the spectra of the series resonance circuit before the period doubling bifurcation (FIGS. 1c and 1d), and after the period doubling bifurcation (FIGS. 1e and 1f).

Figure 1C:
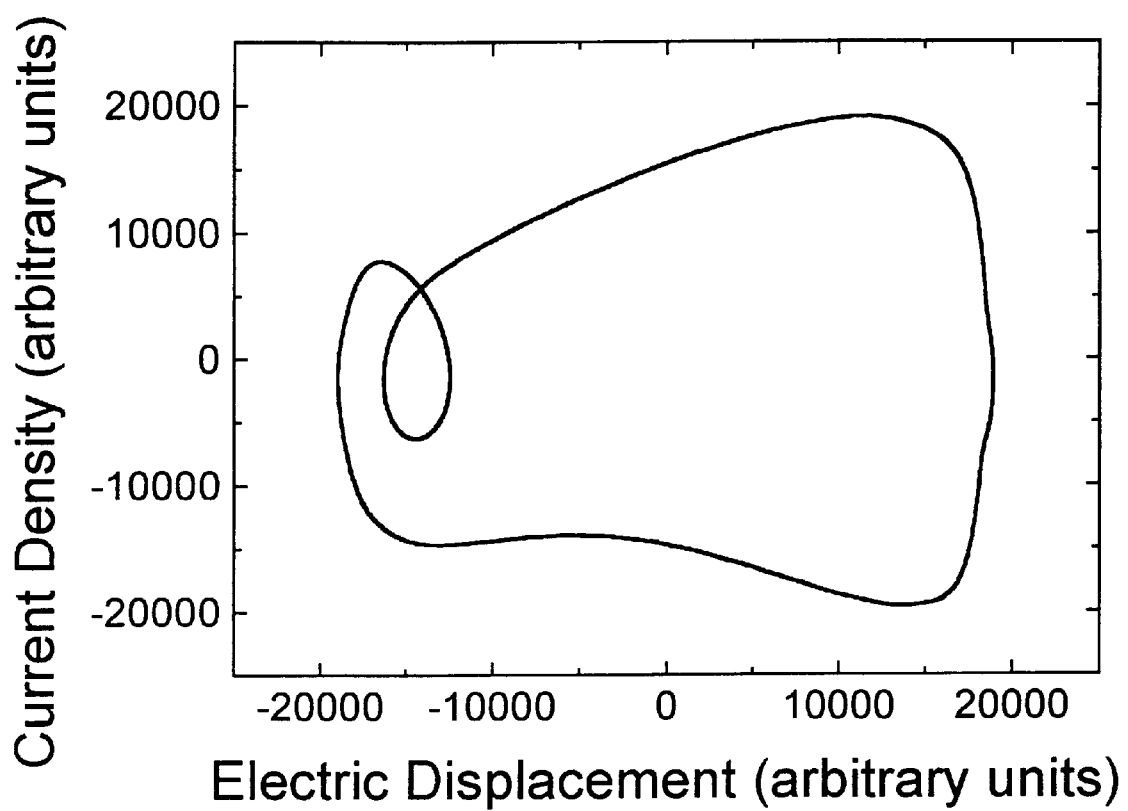
FIG. 1c shows a plot of current density vs. electrical displacement as observed on the display of FIG. 1b.
Figure 1D:
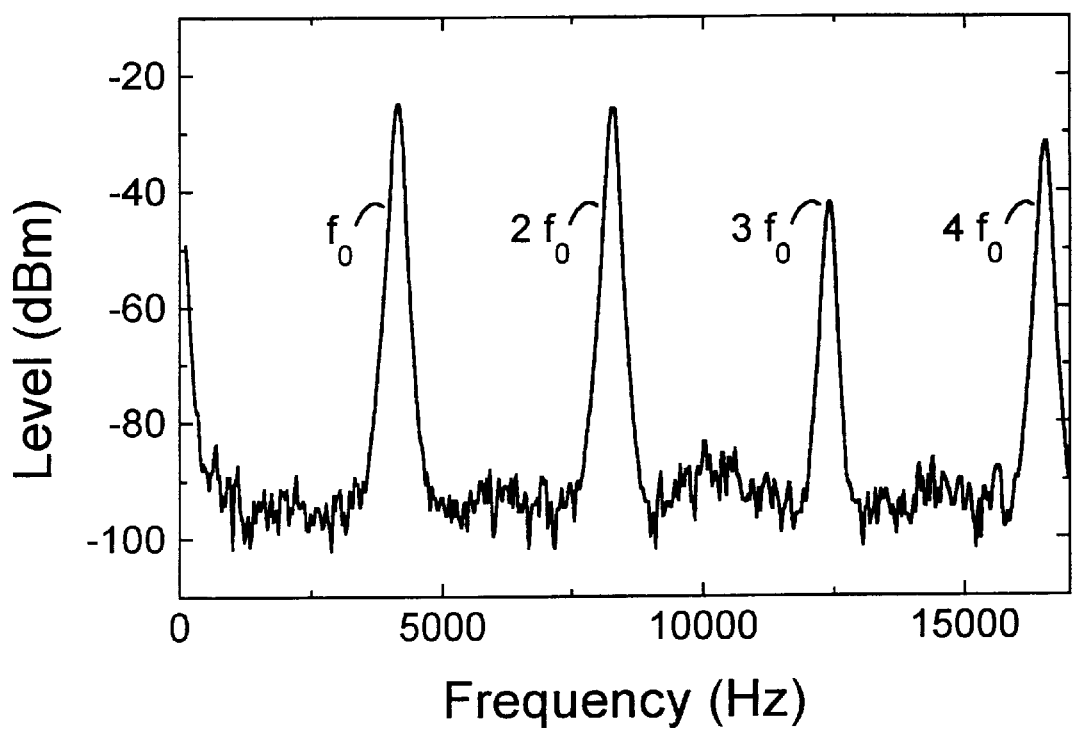
FIG. 1d shows the power spectrum for a period 1 behavior for the circuit of FIG. 1b.
Figure 1E:
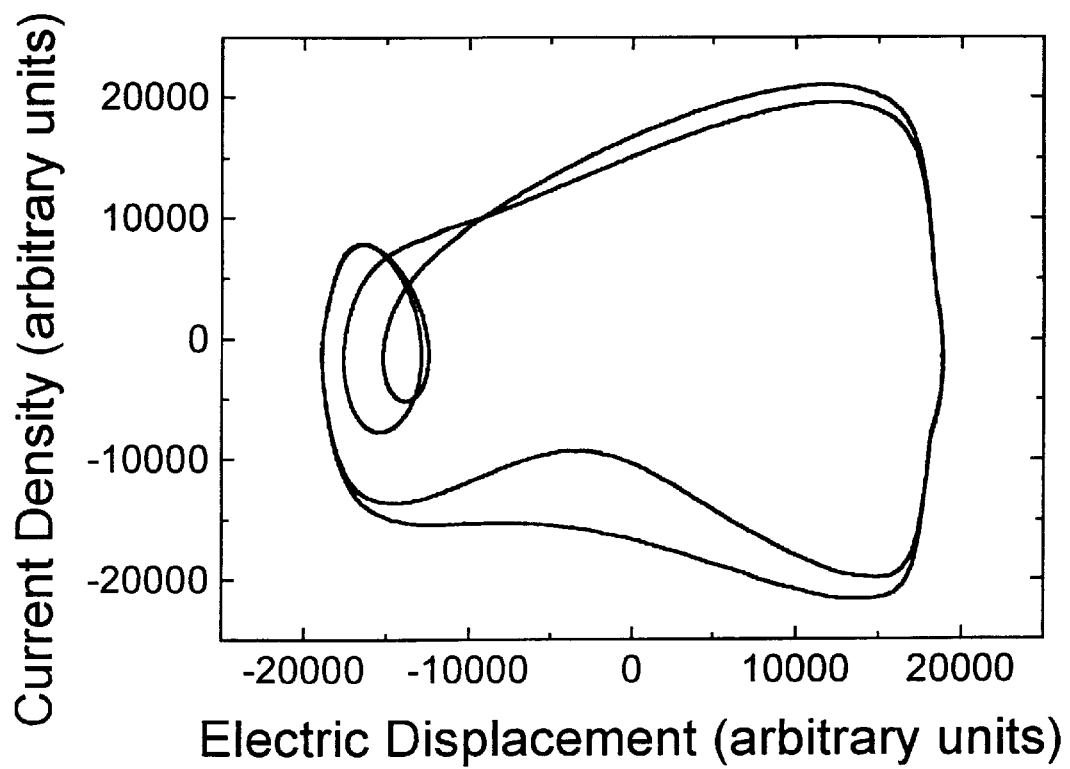
FIG. 1e shows the period 2 behavior of the circuit of FIG. 1b when the driving voltage was increased.
Figure 1F:
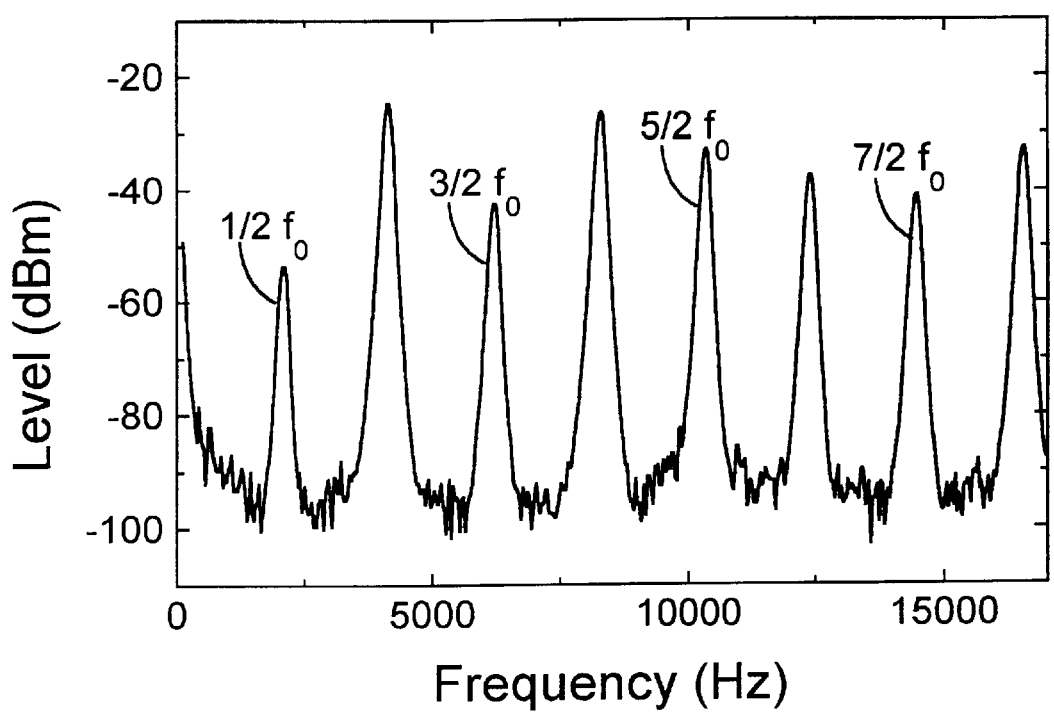
FIG. 1f shows the power spectrum for a period 2 behavior of the circuit of FIG. 1b.

FIG. 1c shows the period-1-behavior of the phase portrait of the series-resonance circuit, and its power spectrum is shown in FIG. 1d. FIG. 1e shows the period-2-behavior of the phase portrait of the same circuit, when the amplitude of the driving voltage 9 was increased. In FIG. 1c, the signal always returns exactly after one cycle of the driving voltage to its original starting point. In FIG. 1e, after the period doubling bifurcation, it takes two cycles to return exactly to the starting point. In the power spectrum drawing of FIG. 1f, that may be observed as additional peaks at one half the driving frequency (½fo), three halves (³⁄₂fo) the driving frequency, etc.

The invention makes use of the state just before the bifurcation (FIGS. 1c and 1d). The incident infra-red radiation has exactly half the driving frequency (½fo) (or an odd multiple thereof). That gives rise to peaks in the spectrum at half the driving frequency (or odd multiples thereof) similar to the spectrum in FIG. 1f. But these peaks are caused by the infra-red radiation and vanish if this radiation is turned off. The height of these peaks depends also strongly on the phase angle between the driving voltage and the infra-red radiation.

The "properly chosen frequency" means the following: If the state near a period doubling bifurcation is used, then the incident infra-red radiation must be modulated with exactly half the driving frequency (or an odd multiple thereof) of the nonlinear dynamic system, e.g. the nonlinear resonance circuit. If the state near a symmetry breaking bifurcation is used, then the incident infra-red radiation must be modulated with another frequency, namely exactly the driving frequency (or an odd multiple thereof) of the nonlinear dynamic system, e.g. the nonlinear resonance circuit.

Figure 2:
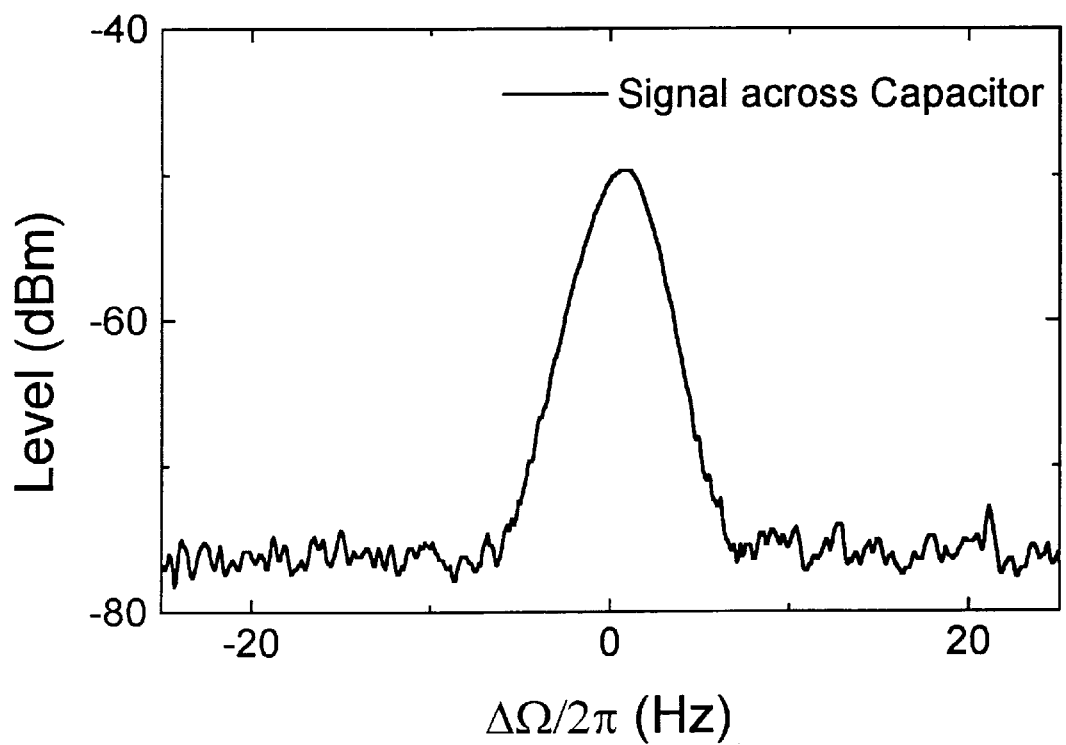
FIG. 2 shows the signal of the detector at a modulation frequency of the infra-red radiation of 5.5 kHz.

FIG. 2 shows the signal from a periodically incident infra-red radiation measured by the detector. The series resonance circuit of FIG. 1a was tuned very close to a period-doubling bifurcation. The frequency of the driving voltage 9 of the circuit was 5.5 kHz. The frequency of the modulation signal of the incident radiation was exactly half the driving frequency. The driving voltage and the modulation of the radiation were phase-locked. The two signals were shifted against each other until the detector signal reached a maximum.

Figure 3:
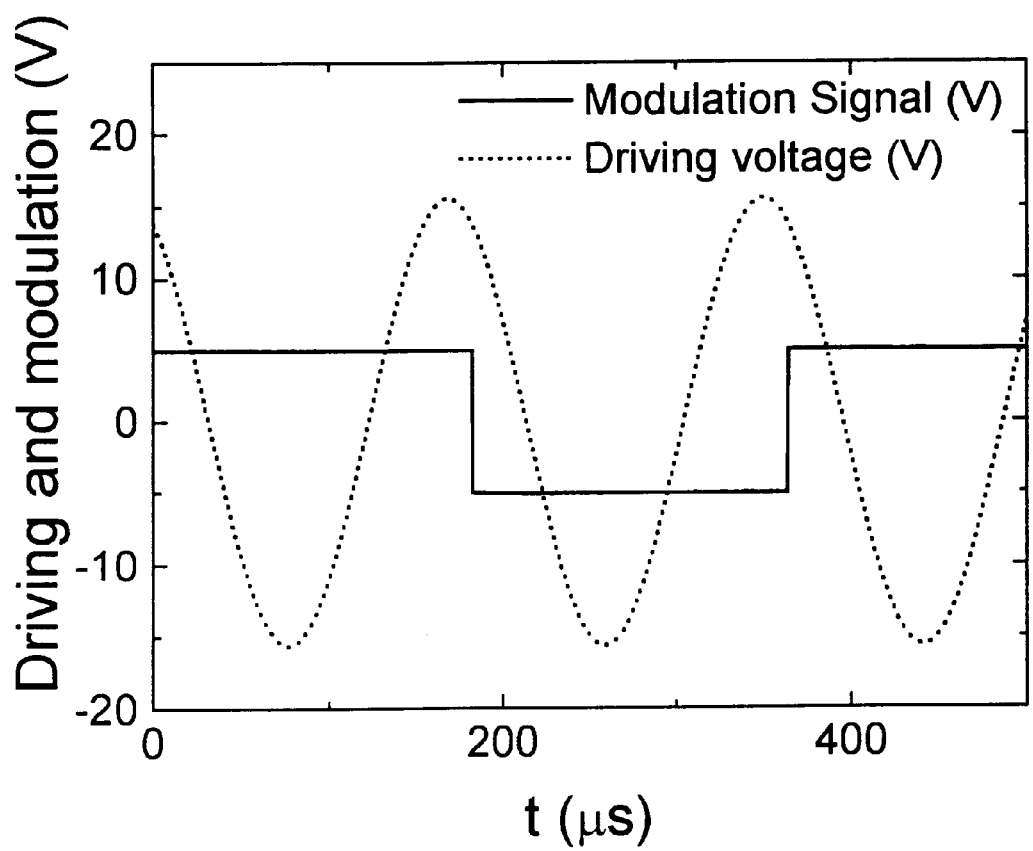
FIG. 3 shows the position of the driving voltage relative to the infra-red signal at a phase angle of −150°.

FIG. 3 shows the phase orientation of the driving voltage relative to the incident infra-red modulation signal when the detector signal reaches a maximum.

Figure 4:
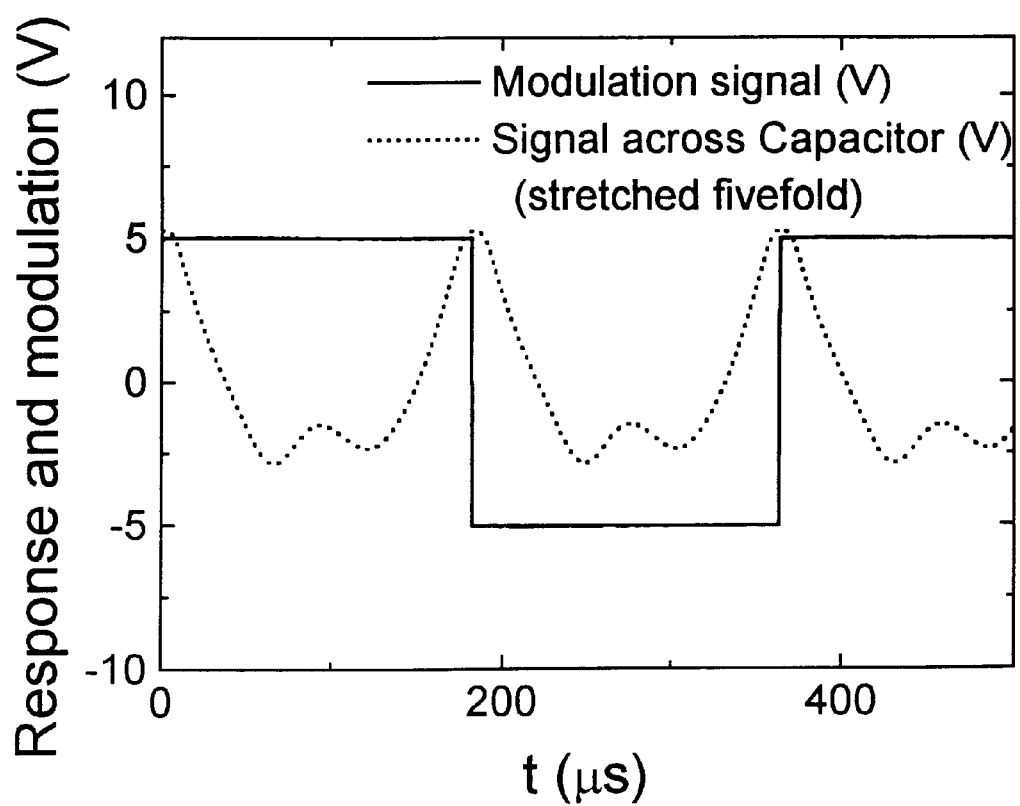
FIG. 4 shows the position of the detector signal across the capacitor C of FIG. 1a relative to the infra-red signal at a phase angle of −150°.

FIG. 4 shows the orientation of the infra-red modulation relative to the signal across the linear capacitor 11 of FIG. 1a or FIG. 1b which is proportional to the polarization P (or dielectric displacement D) of the detector element along the polar axis. This orientation is the result of the tuned orientation of the driving voltage and the infra-red modulation signal.

Figure 5:
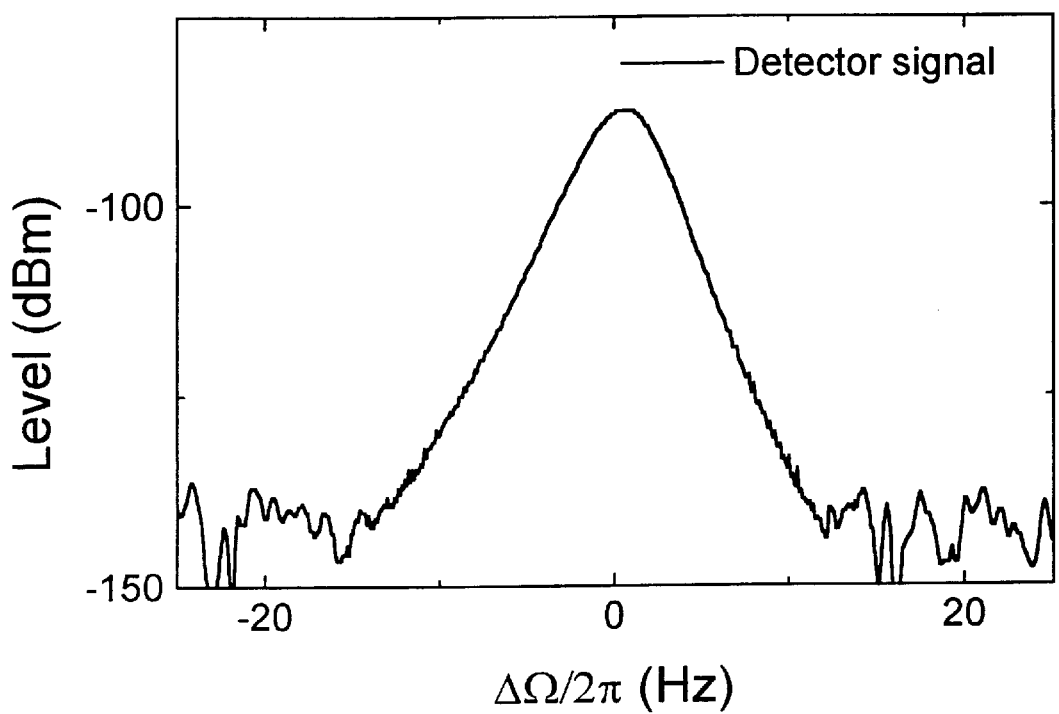
FIG. 5 shows the signal of a traditional pyroelectric detector on the basis of modified TGS caused by the same infra-red radiation as used in FIG. 2.

FIG. 5 shows the signal which the same infra-red radiation causes in a traditional pyroelectric infra-red detector with a modified TGS-element. A comparison of FIG. 2 and FIG. 5 shows that the signal of the new detector is about 60 times higher than the signal of the traditional detector for the same infra-red signal received.

Accordingly, while only a few embodiments of the present invention have been shown and described, it is obvious that many changes and modifications may be made thereunto without departing from the spirit and scope of the invention.

What is claimed is:

1. A method for converting infra-red radiation into electrical signals having a high gain amplification comprising the steps of:

coupling the infra-red radiation to a ferroelectric TGS crystal, which is part of a nonlinear dynamic system;

varying the amplitude and frequency of the driving voltage of the nonlinear dynamic system, or the temperature of said ferroelectric crystal;

stabilizing the nonlinear dynamic system just below its dynamic instability by adjusting the amplitude and frequency of the driving voltage or the temperature of the crystal; and measuring the electrical signal produced by said ferroelectric crystal of infra-red radiation of the predetermined selected frequency.

2. The method according to claim 1, wherein said ferroelectric TGS crystal is part of a series resonance circuit with a linear inductance and a linear capacitor, and said step of stabilizing comprises adjusting the inductance and capacitance of said components to stabilize the circuit near its dynamic instability point so as to convert infra-red radiation incident upon the ferroelectric crystal into the signal that can be measured.

3. The method according to claim 2, wherein the driving voltage and modulation signal of the infra-red radiation are phase locked at an angle to produce a maximum electrical signal to be measured.

4. A device for converting infra-red radiation into electrical signals with a higher than normal effective amplification comprising:

a nonlinear dynamic circuit, containing a ferroelectric crystal, tuned close to and below its dynamic instability for receiving the infra-red radiation, said crystal converting the infra-red signal of a preselected frequency and phase angle relative to the driving voltage into an electrical signal for measurement.

5. The device according to claim 4, wherein said circuit comprises a linear inductor, coupled to said crystal, and a linear capacitor connected in series with said ferroelectric crystal so that a spectrum analyzer can be connected between said crystal and said linear capacitor for reading the electrical signal across the said linear capacitor to be measured.

6. The device according to claim 5, wherein said crystal comprises a triglycine sulphate crystal (TGS).

* * * * *